United States Patent [19]
Edmonds et al.

[11] Patent Number: 6,049,459
[45] Date of Patent: Apr. 11, 2000

[54] NESTING CLAMPS FOR ELECTRICAL COMPONENTS

[75] Inventors: Gary M. Edmonds, Bedminster, N.J.; William J. Edwards, Rockwall, Tex.; Eric K. McDonald, Rowlett, Tex.; An B. Nguyen, Richardson, Tex.; Kevin G. Shaw, Dallas, Tex.; Edward Yanowski, Mesquite, Tex.; Richard J. Yeager, Rockwall, Tex.; Steven J. Vargo, Midlothian, Tex.

[73] Assignee: Lucent Technologies, Inc., Murray Hill, N.J.

[21] Appl. No.: 09/192,928

[22] Filed: Nov. 16, 1998

Related U.S. Application Data

[60] Provisional application No. 60/065,985, Nov. 17, 1997.

[51] Int. Cl.$^7$ ........................................... H05K 7/20
[52] U.S. Cl. .................... 361/707; 165/80.3; 165/185; 174/16.3; 257/726; 361/715
[58] Field of Search .................. 165/80.2, 80.3, 165/185; 174/16.3; 257/718, 719, 726, 727; 361/704, 707, 709–710, 715

[56] References Cited

U.S. PATENT DOCUMENTS

| 5,483,103 | 1/1996 | Blickhan et al. | 257/718 |
| 5,648,889 | 7/1997 | Bosli | 361/704 |
| 5,896,270 | 4/1999 | Tsui | 361/704 |

*Primary Examiner*—Gregory Thompson
*Attorney, Agent, or Firm*—Locke Liddell & Sapp LLP

[57] ABSTRACT

Spring clips with nesting end portions are disclosed for use in securing heat generating electrical devices to a support surface, such as a heat sink. The nesting end portions of the clips depend downwardly below the main body portion to prevent contact with edges of electrical devices of varying height and width. Thickness and temper of the clips provide some flexibility so there is less variability in clamping force applied to the clamped devices by the clip in response to tightening of the attachment means and torquing of the fastening means becomes less critical.

11 Claims, 3 Drawing Sheets

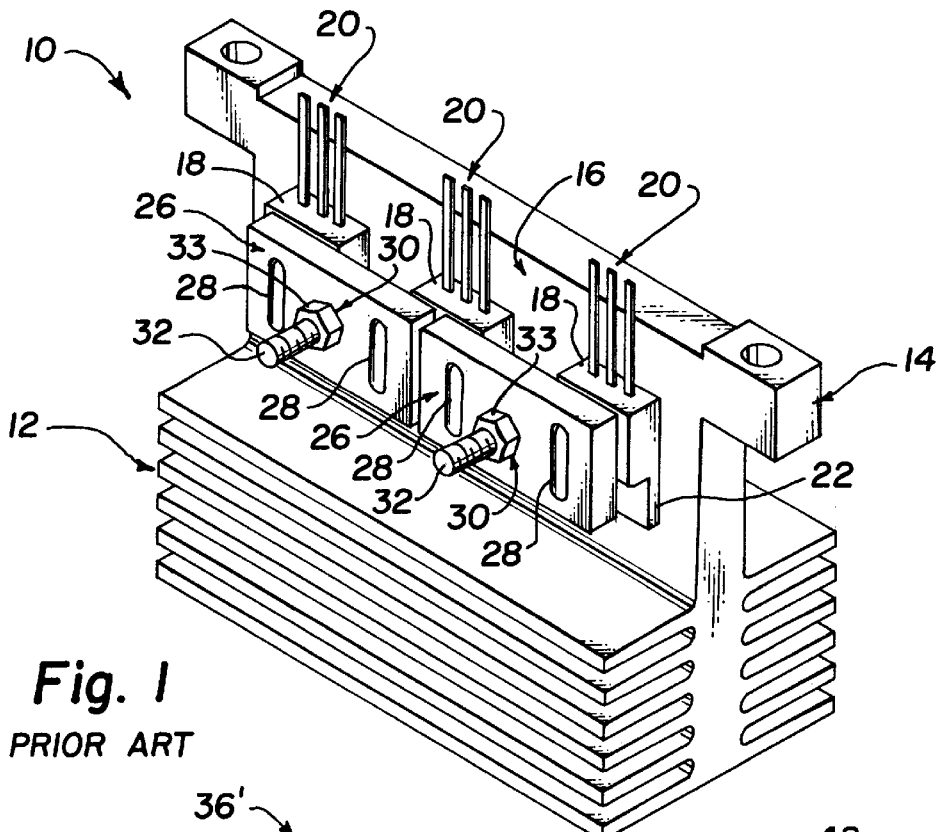
Fig. 1
PRIOR ART
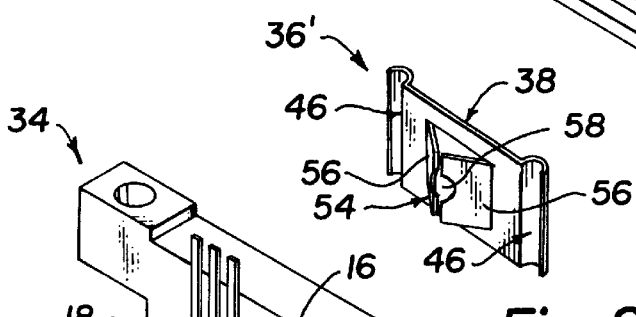
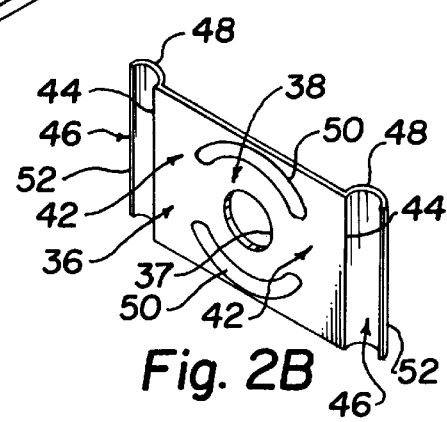
Fig. 2A
Fig. 2B
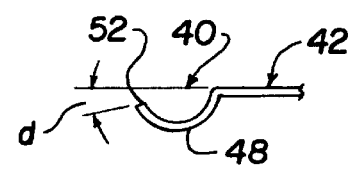
Fig. 2C
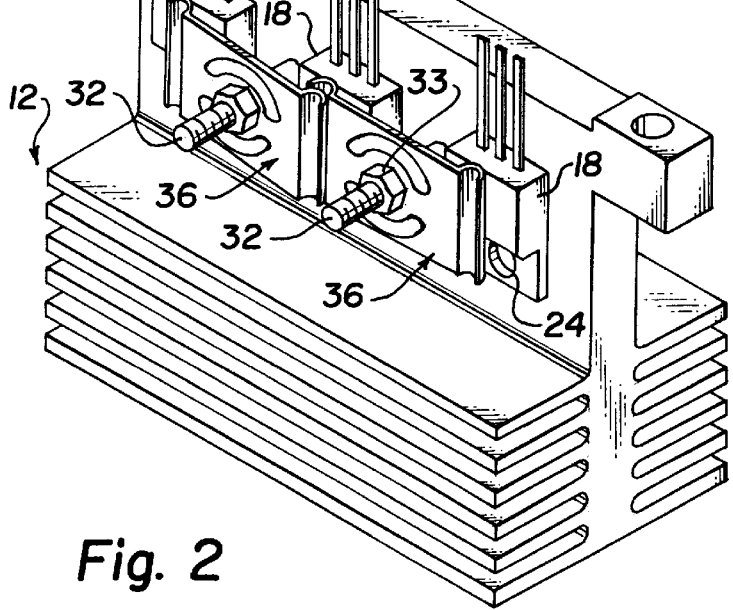
Fig. 2

NESTING CLAMPS FOR ELECTRICAL COMPONENTS

IN THE CROSS REFERENCE TO RELATION APPLICATION

This application claims priority from provisional patent application Ser. No. 60/065,985 filed Nov. 17, 1997 by the same inventors for which benefit is claimed under 35 U.S.C. §119(e)

BACKGROUND OF THE INVENTION

1. Field of the Invention

The invention relates to clamping devices used to secure electrical devices to supporting structures or other electrical components.

2. Description of the Art

One of the most frequent uses of clamping devices in electrical arts involves clamping heat generating electrical components to a substrate. The substrate usually takes the form of a heat sink. Heat generated by the electrical devices is transferred to the heat sink where in turn it is dissipated in ambient or moving air. The supporting surface is conventionally a flat surface along which a plurality of heat generating electrical devices are spaced apart, usually in a linear fashion. A bolt or post is commonly provided extending perpendicularly from the support surface between adjacent devices to served as an attachment means for the clamping devices.

Prior art clamping devices that have been used for this purpose are rectangular pieces cut, for example, from approximately 11 gauge steel. The outer ends have formed depressions which extend below the bottom surface. An opening in the center or offset from the center between the formed depressions receives a bolt or post which connects them to the heat sink. The formed depressions are intended to rest upon the upper surface of the heat generating electrical devices. The known clamping devices are extremely rigid due to their heavy gauge steel construction. Where three electrical devices are to be positioned on the surface, two of the heavy gauge clamping devices have their edges abutted in the middle such that a formed depression on each clamp rests on a side of the device under it and not in the center. It is difficult to simultaneously provide sufficient clamping force to resist vibration and thermal effects while at the same time avoiding cracking of the electrical devices due to over torquing of the fasteners which attach and connect the clamping devices to the substrate. In addition, rigid existing clamps are ill-suited to accommodate varying heights in the electrical devices to be attached to a heat sink. Usually the thicker electrical devices are wider as well as higher which sometimes results in contact between the underside of the clamp and the edge of the larger device. This can lead to damage to the device or application of a torque to the electrical device which tends to create uneven pressure on the clamped device. It can even tend to lift one portion of the heat generating device away from the heat conducting surface which may reduce heat transfer efficiency. This problem is made worse by manufacturing variations especially when the parts come from different sources.

SUMMARY OF THE INVENTION

The present invention is used in combination with a heat sink having a supporting surface and a plurality of heat generating electrical devices spaced along the supporting surface, at least one attachment means and one or more improved clamping devices which serve to hold two of the electrical devices on the support surface. The improved clamping devices comprise a spring clip having some flexibility, yet are stiff enough to apply sufficient clamping force to the heat generating electrical devices. The improved spring clip has a body comprising a center portion having a connection means to cooperate with the attachment means of a support surface for holding the clip in position and for assembly and disassembly. The connection means may comprise an opening for a post or bolt in the center of the body portion or a "Tinnermann" connection formed in body of the spring clip itself.

Nestable lateral extensions are provided on opposite sides of the body portion of the clip which are economically produced by conventional stamping and forming equipment. Each lateral extension terminates in a nestable formed end depending below the plane of the body section and having a contact area configured to press against an electrical device. The distance between the contact areas is about equal to the center-to-center distance between two adjacent electrical devices to be clamped.

The nestable lateral extensions allow the clamping force to be applied over the center of the electrical devices. For a plurality of linearly arranged electrical devices, one spring clip has the contact area of its nestable formed ends in contact with and centered over two adjacent electrical devices. An adjacent spring clip has a contact area of one of its nestable formed ends pressing against the center of a third electrical device whereas its opposite other nestable formed end is nested with and pressing against the nestable formed end of the adjacent spring clip. Both nestable ends are nested and centered over the intermediately located electrical device.

In this way, three electrical devices on the support surface are held with two clamping devices and the clamping force is applied to the center of each electrical device. Where the electrical devices are at least four, three clamping devices are used to hold the electrical devices on the support surface wherein at least one of the clamping devices has both of its nestable ends formed in a nesting relationship with the nestable formed end of an adjacent clamping device. This arrangement may continue indefinitely with adjacent clamping devices having their ends nested over the center of an electrical device on the support surface, except for the last clamp on each end of a row.

Because the spring clips are always centered over adjacent electrical devices, attachment means comprising posts or screws can extend from the support surface centered between adjacent electrical devices and the spring clip has a centered connection means for connecting to such an attachment means. This can take the form of an opening through which a bolt or a post extends. Alternately, the body of the spring clip can be formed to have raised opposed legs which comprise a facsimile of a "Timmermann" type fastener.

An advantage is provided by the limited flexibility of the spring clip which is sufficient to apply the desired clamping force but allows the spring clip to flex slightly when the bolt or nut comprising the attachment means is torqued down thereby providing greater tolerance for manufacturing variations, less chance of damaging the parts and better resistance to vibration. This flexing allows the clip to "give which reduces the sensitivity to torque on the attachment means during assembly. The spring clip is forgiving if too much or too little torque is applied to the nut or bolt clamping it down. The much stiffer conventional clamp is not forgiving. There is only a limited range between too little clamping force and excessive clamping force which can damage the electrical devices being clamped. The body of the clip may be provided with stamped in stiffening elements to prevent excessive bending. An additional advantage is that the spring clips are backward compatible with existing heat sink structures.

A particular advantage is obtained by the improved clamping device in that the spring clip is well suited to clamping adjacent electrical devices where some of them are of different thickness or width. In that case, the central body portions of the spring clips are at angular orientation with respect to each other and to the flat support surface. The lateral extensions at the edge of each spring clip are formed into nestable arcuate shape preferably approximately a half cylindrical shape depending at one side below the center body portion to provide clearance for clamping electrical devices of varying heights without contacting or damaging the edges of the higher electrical device being clamped. In addition, the outermost edge of the arcuate nesting portions lie below the plane of the center body portion of the clip. This facilitates nesting of the edges of adjacent spring clips as, for example, when the center one of three electrical devices is significantly higher than the other two. This configuration prevents interference between the extreme outer edge of one nested spring clip which lies under the body portion of the adjacent spring clip. There is also a material savings and reduction in weight as well as inventory due to the symmetrical nature of the clamping devices.

BRIEF DESCRIPTION OF THE DRAWINGS

FIG. 1 is a perspective view illustrating a heat sink with a supporting surface where three heat generating electrical devices are being held in place by two conventional clamping devices;

FIG. 2 is the same perspective view as in FIG. 1 with two improved clamping devices of the present invention clamped with nestable edges clamping the three electrical devices against the supporting surface;

FIG. 2A is a perspective which illustrates a modification of the improved spring clip clamping device of FIG. 2 wherein a connection means is provided by a "Tinnerrnann" feature formed in the body of the clip;

FIG. 2B is a perspective view of the improved spring clip used in FIG. 2 with a connection means comprising an opening in the center of the body portion surrounded by opposed stiffening means;

FIG. 2C is partial transverse section view of the improved spring clip of FIG. 2B;

DETAILED DESCRIPTION OF THE PREFERRED EMBODIMENT

Figure 3A:
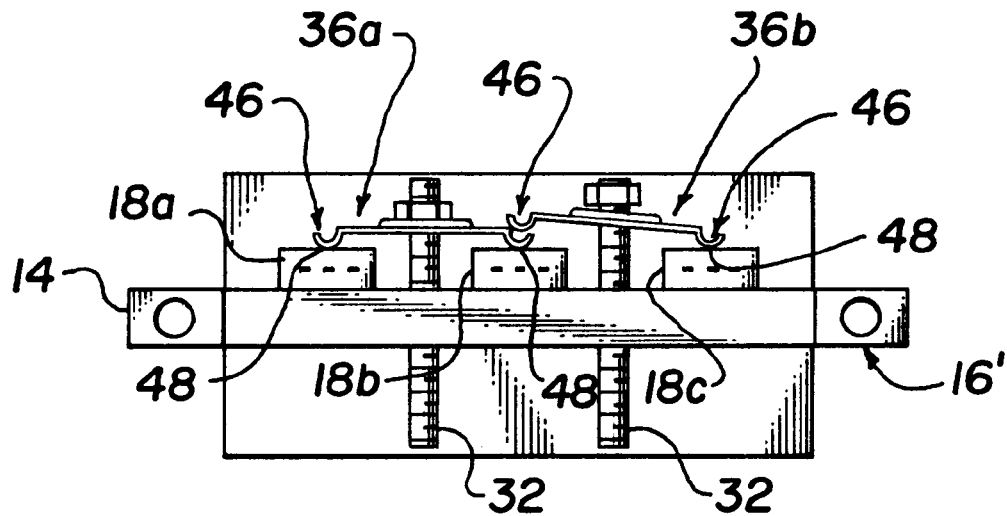
FIG. 3A is a top view of the improved clip heat sink combination showing how nested ends come together over the center of adjacent electrical devices.

In the description that follows, like items will be assigned the same reference numerals as far as possible. FIG. 1 shows the combination of a heat sink, a plurality of heat generating electrical devices, attachment means and two conventional clamping devices, which is generally referred to by the reference numeral 10. The heat sink 12 may take any conventional form. Heat sink 12 has a wall 14 having a supporting surface 16 on either side. Supporting surface 16 is generally a planar surface on which a plurality of heat generating devices 18 are spaced apart in a linear fashion along the supporting surface. Most commonly the electrical devices are transistors of various kinds involved in power supply or amplification.

Combination 10 includes electrical devices 18 having three electrical leads 20. Chips of this type often have an integral metal base 22 which may have an opening 24 which may be used for attaching it in some applications. Normally, supporting surface 16 will include a thin layer of an insulating material which is thermally conductive underneath electrical devices 18.

Combination 10 includes a pair of conventional clamps 26 made of rigid material and assembled to clamp three devices 18 against supporting surface 16 as shown. Conventional clamps 26 include formed depressions 28 which are pressed in from one side and bulge out the other side to extend below the lower surface. An opening 30 (hidden) comprises connection means for connecting clamps 26 to attachment means 32. Attachment means 32 comprises a bolt or post which may be threaded to accept a nut 33 which is torqued down to force clamps 26 against devices 18. Although depressions 28 on the outside electrical devices are in contact with and centered over a device 18, depressions 28 on the inside are necessarily not centered over middle device 18. Because clamps 26 do not give or flex, it is difficult to obtain sufficient clamping force to securely hold devices 18 without over torquing attachment means 32, 33 and thereby applying excessive pressure to the vulnerable outer edge portions of the plastic bodies of the chips. Such excessive pressure can lead to cracking which is hard to detect.

FIG. 2 shows a combination generally referred to by the reference numeral 34 exactly like that of FIG. 1 except showing the use of the improved clamping devices. FIGS. 2B and 2C respectively show a perspective view and a partial transverse section through the improved clamping device of the present invention. FIG. 2A is an alternative improved clamping device.

In FIG. 2, combination 34 includes heat sink 12 having supporting surface 16 with a plurality of spaced apart heat generating electrical devices 18 spaced along the support surface being clamped by means of improved clamping devices 36 comprising spring clips. Spring clips 36 have a connection means 37 comprising an opening (FIG. 2B) and are mounted in clamping position to hold devices 18 with attachment means 32 which may take any conventional form.

By reference to FIGS. 2B and 2C, improved clamping device 36 comprises a spring clip having a body comprising a center portion 38 having a connection means 37 designed to cooperate with attachment means 32 for holding the clip in clamping position over the support surface. Center body portion 38 preferably lies in a flat plane and has lateral extensions 42 extending to opposite sides from the center. Lateral extensions 42 terminate at 44 in a nestable formed end 46 which comprise a nestable arcuate shape which depends below the plane 40 in which center body portion 38 lies. The primary requirement of nestable formed ends 46 is that they are designed to nest in good contact with another nestable formed end of any other spring clip 36.

Each nestable formed end 46 has a contact area 48 at its lowest point configured to press against an electrical device 18 as seen in FIG. 2. Preferably the nestable arcuate shape of the formed ends 46 is approximately a half cylindrical shape depending at one side from an edge of a body portion 38, 42. The arcuate shape makes it possible for the contact area or contact line 48 to press against devices 18 even if spring clip 36 is tilted at an angle from support surface 16. Finally, curved stiffening ridges 50 may be formed around opening 37 to improve stiffness of the relatively thin spring steel from which the clips are preferably made. The outer edge 52 of nestable formed ends 46 lies below the plane 40 of body portion 38, 42 by distance "d" to facilitate nesting when adjacent spring clips are at different angles relative to the support surface. This relief prevents edge 52 from the clip nested under an adjacent clip from contacting the body of the uppermost clip and causing the nesting edges to disengage.

FIG. 2A illustrates a variation 36' of an improved clamping device wherein the only difference is in the connection means. A connection means 54 is formed at the center portion 38 of spring clip 36' by partially severing out raised portions 56 having opposed rounded notches 58 which face each other to form an opening like that of a "Tinnermann" type connection. The raised portions 56 are sprung apart by passage of a bolt or post 32 between them during installation of the spring clip thereby simplifying assembly with the attachment means in that there is no need for turning a nut or bolt to hold the device in place.

Figure 3B:
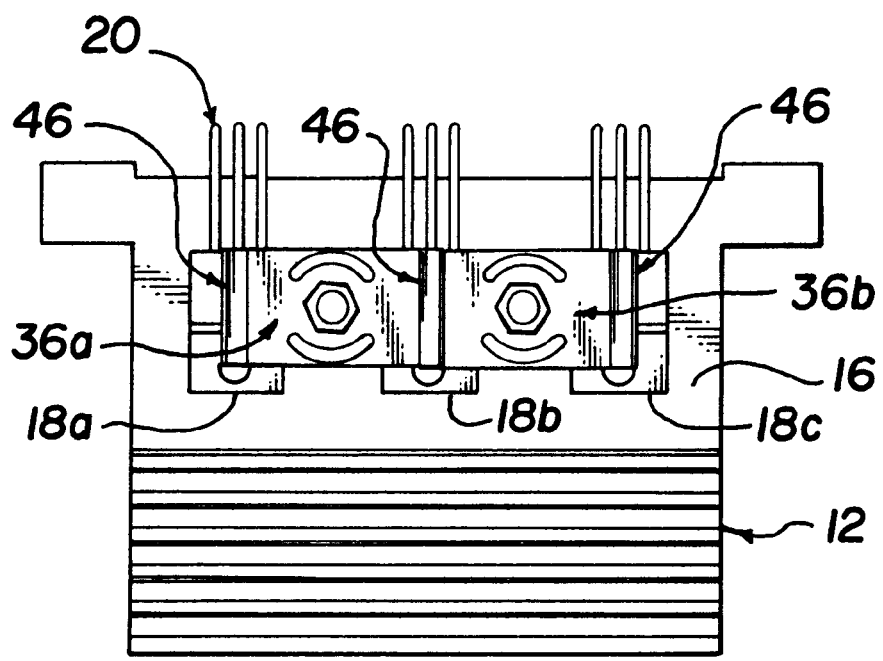
FIG. 3B is a side elevation of the combination shown in FIG. 3A.

FIGS. 3A and 3B illustrate the application of two clamping devices or clips 36a and 36b to clamp three electrical devices 18a–c which are uniform in size. The clamping devices are referred to as 36a and 36b even though they are identical. The contact areas 48 of clip 36a are pressing firmly against the center of two devices 18a and 18b. The contact area 48 of clip 36b is pressing against the center of device 18c. The nestable formed end 46 of device 36b is shown just approaching its nesting position with a nestable formed end 46 directly over the center of device 18b. Formed ends 46 nest in direct contact with each other. Alternately, the formed end 46 of clip 36b could be in contact with device 18b and formed end 46 of device 46a nested on top of it. It is noted that there is another contact surface 16' on the other side of wall 14 which could be provided with electrical devices and clamped the same way against surface 16'.

Figure 4A:
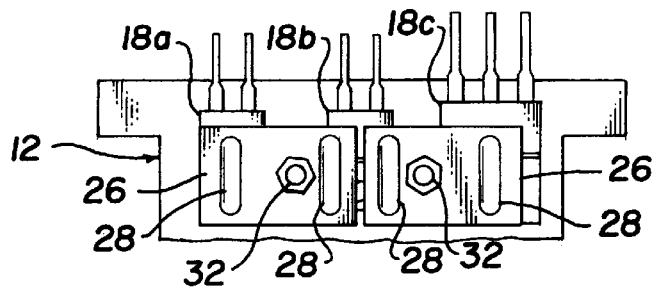
FIG. 4A is a side elevation showing the use of two adjacent conventional clamping devices where one of the electrical devices is enlarged laterally and vertically relative to the other two electrical devices.
Figure 4C:
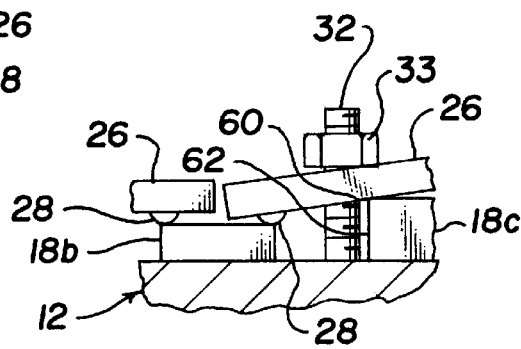
FIG. 4C is an enlargement of the circled area from FIG. 4B.
Figure 4B:
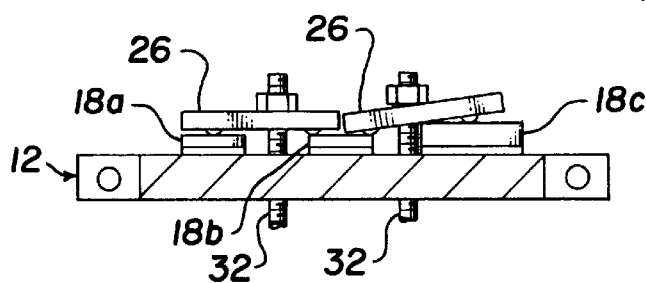
FIG. 4B is a top view illustrating a problem arising from use of the rigid conventional clamping device which occurs when one of the adjacent electrical devices is thicker than an adjacent electrical device.

FIGS. 4A, 4B and 4C illustrate an additional problem that occurs in using two conventional clamps 26 to secure three spaced apart electrical devices 18a, 18b, and 18c, where one of the devices 18c is significantly higher and wider than the other two devices. Here the inside corner edge 60 of edge 62 of the vertically higher electrical device 18c has come in contact with the underside of clamp 26. When attachment means 32, 33 is torqued down, corner edge 60 may be subject to excessive stress or broken. Notice also that the force is applied over a small area at the inside side edge 62 which tends to cause device 18c to press into the insulating layer beneath (not shown) and tilt slightly in the direction of the applied force. This tends to prevent uniform thermal contact with supporting surface 16 of heat sink 12. Also, the location of formed depressions near the side edges of devices 18 creates stress that can cause fractures if excessive torque is applied to nut 33.

Figure 5A:
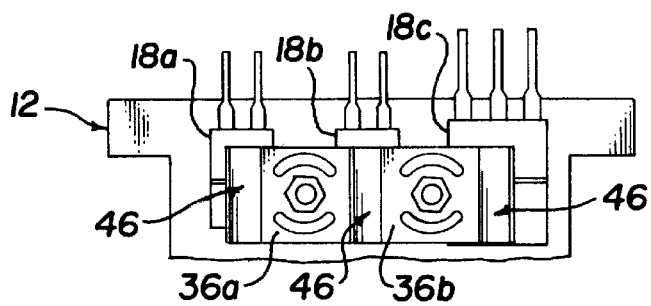
FIG. 5A illustrates two of the improved clamping devices holding two electrical devices of one size and a third electrical device of a greater size against the supporting surface of a heat sink.
Figure 5B:
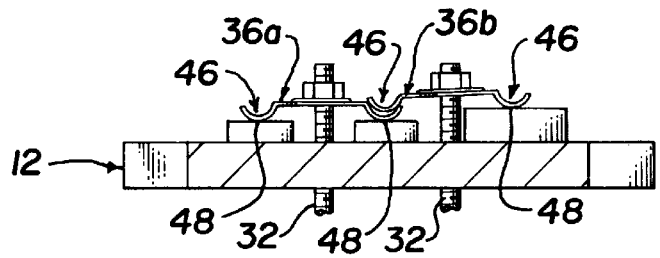
FIG. 5B is a top view of the combination of FIG. 5A illustrating how the improved clamping device accommodates variations in height of the electrical devices without the danger of damaging them.

FIGS. 5A and 5B show how the improved clamps 36a, 36b are configured to contact each of the devices 18a, 18b and 18c by pressing the contact area against the center of their upper surface notwithstanding the fact that device 18c is significantly higher and wider than devices 18a and 18b. The fact that the nestable formed ends depend below the plane of the body portion of clips 36a, 36b provides clearance sufficient to avoid any contact with the corner edge 60 of device 18c. Clamping is more uniform because the clamping force provided by the improved clip is directed normal to the support surface 16 even when there is a substantial difference in the size of adjacent electrical devices.

Figure 6:
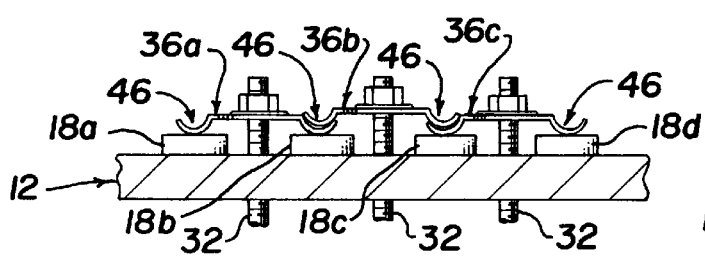
FIG. 6 illustrates a schematically shown top view of three or more clamping devices for clamping four or more adjacent electrical devices showing how each end of a given clamping device will nest with the formed nestable end of an adjacent clamping device to clamp the center of adjacent electrical devices on the support surface.

FIG. 6 is a somewhat more schematic illustration of how at least three spring clips 36 may be used to clamp at least four electrical devices 18a–d spaced apart along a support surface 16. It will be noted that the process can be continued by adding an equal number of additional clamping devices to the number of electrical devices added. It indicates that except for the outer end 46 clamp 36a and of the corresponding clamp 36 which will appear on the opposite side of the line of clamping devices, in this case 36c, the remainder of the clamps 36 have both of their nestable formed ends 46 nested with the end 46 of the adjacent spring clip. Clip 36b has one end nested with an end of clip 36a and the other end nested with an end of clip 36c. It is evident that it makes no difference whether nestable formed end 46 of 36a and 36c are pressing against the devices 18 or whether the contact area of clip 36b is pressing directly against devices 18 since the same clamping force is provided over the center of the devices normal to support surface 16 in either case.

The improved spring clip 36 is preferably about 0.030 inch thick austempered spring steel and is typically about 0.80 inches between the center line of contact points 48 and about 0.60 inches wide, although obviously it can be smaller or larger. This compares to the prior art clamping device 26 which is typically made of 11 gauge cold rolled steel having a thickness of about 0.12 inches.

While the invention is described in conjunction with a preferred embodiment thereof, modifications and changes therein may be made without departing from the spirit and scope of the invention as defined by the claims appended hereto.

We claim:

1. In the combination of a heat sink having a supporting surface and a plurality of heat generating electrical devices spaced apart along the supporting surface, at least one attachment means and at least one clamping device which serves to hold at least two of the electrical devices on the support surface, an improved clamping device comprising:

the at least one clamping device comprising a spring clip having a body comprising a center portion having connection means to cooperate with the attachment means for holding the clip in position over the support surface and lateral extensions on opposite sides from the center wherein each lateral extension terminates in a nestable formed end having a contact area configured to press against a device wherein the distance between said contact areas is about equal to the center-to-center distance between two adjacent devices; and wherein one of said clamping devices has the contact area of one of its extensions pressing against one electrical device and the contact area of the other extension pressing against a second adjacent electrical device while another of said clamping devices has the contact area of one of its extensions pressing against a third adjacent electrical device and the other of its extensions nested and pressing against the nestable formed end of said one clamping device thereby holding three electrical devices on the support surface with two clamping devices.

2. The combination of claim 1 wherein the plurality of electrical devices is at least four, the at least one clamping device further includes at least a third one of the clamping devices securing said at least four of the electrical devices on the support surface wherein at least one of the clamping devices has both of its nestable formed ends in nesting relationship with the nestable formed end of an adjacent clamping device.

3. The combination of claim 2 wherein the lateral extensions of the spring clip can be said to be in a flat plane whereas the nestable formed ends have a nestable arcuate shape depending below said plane.

4. The combination of claim 3 wherein each said nestable arcuate shape is configured approximately as a hollow half cylindrical shape depending near an edge of said lateral extension having an outermost edge configured to facilitate nesting when adjacent spring clips are at different angles relative to the support surface.

5. In the combination of a heat sink having a supporting surface and a plurality of heat generating electrical devices spaced apart along the supporting surface, at least one attachment means and at least one clamping device which serves to hold at least two of the electrical devices on the support surface, an improved clamping device comprising:

the at least one clamping device comprising a spring clip having a body comprising a center portion having connection means to cooperate with the attachment means for holding the clip in position over the support surface and lateral extensions on opposite sides from the center wherein each lateral extension terminates in a nestable formed end having a contact area configured to press against a device wherein the distance between said contact areas is about equal to the center-to-center distance between two adjacent devices; and wherein the connection means at the center portion of the spring clip is formed by partially severing out raised portions which are sprung apart by passage of the attachment means during installation of the clamping device thereby simplifying assembly of the at least one clamping device onto the supporting surface of a heat sink.

6. A method of clamping a plurality of heat generating electrical devices spaced apart along a supporting surface of a heat sink, the method comprising:

providing at least two heat generating electrical devices spaced apart along the supporting surface;

providing at least two clamping devices each comprising a spring clip having a center body portion comprising a connection means for holding the clip in position over the support surface, the spring clip having lateral extensions on either side of the center body and terminating in oppositely oriented nestable formed ends configured to have a contact area positioned to press against about the center of adjacently positioned electrical devices;

attaching one of the clamping devices to the support surface so that the contact area of the formed end on each side presses firmly against adjacent electrical devices to hold them in place on the support surface; and attaching another of said at least two clamping devices to the support surface so that one of its nestable formed ends is nested with a nestable formed end of said one clamping device while its other nestable formed end presses firmly against an adjacently positioned electrical device thereby holding the electrical devices in place on the support surface.

7. The method of claim 6 further including:

the step of providing clamping devices includes the step of depending said nestable formed ends below said center body portion;

the step of providing at least two electrical devices provides one electrical device that is significantly higher above the support surface than an adjacent electrical device; and one of the attaching steps is performed by bridging the higher electrical device and an adjacent lower electrical device with said spring clip without contacting an edge of the higher electrical device laying beneath the spring clip.

8. The combination of claim 6 wherein the attaching steps are performed by tightening a screw, bolt or nut at the connection means and accompanied by a slight flexing of the spring clips across their body portion to allow more variance in the control of the amount of tightening required in the performance of the attaching steps.

9. The combination of claim 7 wherein an attaching step is accomplished by the step of torquing a screw, bolt or nut and accompanied by slight flexing of a spring clip across its body portion to reduce the sensitivity of the attaching step to the amount of torque applied.

10. The combination of claim 7 wherein the step of attaching one of the clamping devices to the support surface is accomplished by the step of securing a clamping device on a post wherein the step of securing the clamping device is accompanied by slight flexing of the clamping device to reduce the sensitivity of the attaching step to force imposed upon the clamping device by the securing step.

11. In the combination of a heat sink having a support surface and three heat generating electrical devices spaced apart along the support surface and being held in place on the support surface by two clamping devices attached to said support surface, the improvement comprising:

the clamping devices are a pair of spring clip clamping devices having a central body portion having oppositely extending lateral extensions and nestable formed ends on the lateral extensions wherein a nestable formed end of one spring clip is nested with a nestable formed end of the other spring clip in joint support of an electrical device on the support surface.

* * * * *